United States Patent
Chuang et al.

(10) Patent No.: US 11,481,536 B2
(45) Date of Patent: Oct. 25, 2022

(54) METHOD AND SYSTEM FOR FIXING VIOLATION OF LAYOUT

(71) Applicants: TAIWAN SEMICONDUCTOR MANUFACTURING COMPANY, LTD., Hsinchu (TW); TSMC NANJING COMPANY LIMITED, Nanjing (CN)

(72) Inventors: Yi-Lin Chuang, Taipei (TW); Song Liu, Nanjing (TW); Pei-Pei Chen, Nanjing (TW); Heng-Yi Lin, Taichung (TW); Shih-Yao Lin, Hsinchu (TW); Chin-Hsien Wang, Hsinchu (TW)

(73) Assignees: TAIWAN SEMICONDUCTOR MANUFACTURING COMPANY, LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 0 days.

(21) Appl. No.: 17/115,668

(22) Filed: Dec. 8, 2020

(65) Prior Publication Data

US 2022/0147691 A1  May 12, 2022

(30) Foreign Application Priority Data

Nov. 6, 2020  (CN) .......................... 202011230270.3

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .. G06F 30/398; G06F 2119/18; G06F 30/392; G06F 2111/04; G06F 30/30; G06F 30/394; G06F 30/33; G06F 2111/20; G06F 2119/12; G06F 30/367; G06F 30/3953; G06F 2111/08; G06F 30/39; G06F 30/3947; G06F 30/20; G06F 2119/06; G06F 30/27; G06F 30/396; G06F 30/327; G06F 16/90335; G06F 2119/02; G06F 2119/10; G06F 30/18; G06F 30/337; G06F 30/373; G06F 30/36; G06F 2111/12; G06F 2115/08; G06F 30/3323; G06F 2111/10;
(Continued)

(56) References Cited

U.S. PATENT DOCUMENTS 7,380,227 B1 * 5/2008 Li .......................... G06F 30/398
716/112
7,568,174 B2  7/2009 Sezginer
(Continued)

FOREIGN PATENT DOCUMENTS

TW  432302 B  5/2001

*Primary Examiner* — Binh C Tat
(74) *Attorney, Agent, or Firm* — Maschoff Brennan

(57) ABSTRACT

A method includes the following operations: receiving design rule violations of a first layout; classifying, according to first chip features of the first layout, a first violation of the design rule violations into a first class of predefined classes; generating a first vector array for at least one of the first chip features of the first layout, that is associated with the first violation; selecting, according to the first vector array, first operations from pre-stored operations; generating a second layout based on the first layout and the first operations.

20 Claims, 12 Drawing Sheets

(58) Field of Classification Search
CPC ............ G06F 2119/08; G06F 30/3308; G06F 30/333; G03F 1/36; G03F 1/84; G03F 7/70433; G03F 7/70441; G03F 7/70666; G03F 1/00; G03F 1/70; G03F 7/70466; H01L 27/0207; H01L 23/49838; H01L 27/11807; H01L 51/0013; H01L 51/0047; H01L 51/0025
USPC .................................. 716/100–106, 110–117
See application file for complete search history.

(56) References Cited

U.S. PATENT DOCUMENTS

| | | | | |
|---|---|---|---|---|
| 7,784,010 B1* | 8/2010 | Balsdon | ................ | G06F 30/394 |
| | | | | 716/137 |
| 2002/0166103 A1* | 11/2002 | Rittman | ................ | G06F 30/398 |
| | | | | 716/52 |
| 2005/0022151 A1* | 1/2005 | Rittman | ................ | G06F 30/398 |
| | | | | 257/734 |
| 2011/0145770 A1* | 6/2011 | Brooks | ................ | G06F 30/398 |
| | | | | 716/102 |
| 2014/0317580 A1* | 10/2014 | Ye | ........................ | G06F 30/20 |
| | | | | 716/53 |

* cited by examiner

| | | VIOLATIONS CLASSIFICATIONS | | | | | |
|---|---|---|---|---|---|---|---|
| | | LEVEL 0 | LEVEL 1 | LEVEL 2 | LEVEL 3 | CATEGORY | FIXING STRATEGY |
| R61 | PROCESS | VIOLATION TYPE (RULE NAME ONLY) | VIOLATION TYPE (APR VIOLATION TYPE) (WITH SOME INTERPRETATION) | SHAPE | ENVIROMENT | | |
| V61 R62 | n6 | H210.M1.CS.13 | ADJACENT CUT SAME MASK SPACING | SIGNAL ONLY | BLOCKED BY PG | SHORT ISSUE | MOVE CELL |
| V62 R63 | n7 | M1.C.14 | ANTENNA VIOLATIONS | CLOCK ONLY | UNDER MACRO | PURE PG ISSUE | ADD ROUTING BLOCK |
| V63 R64 | n22 | G.4:M2i | CUT DIFFERENT LAYER SPACING | SIGNAL TO PG | CUT ENCLOSURE PARALLEL | PIN ACCESS ISSUE | REROUTE |
| R65 | N5FF | M2.S.7 | CUT EOL SPACING | CLOCK TO PG | FAT PIN | BAD VIA ISSUE | NO FIX |
| R66 | General Rule | M2.S.8 | CUT SPACING | SIGNAL TO CLOCK | LOCAL CONGESTION | NON-PREFER ROUTE ISSUE | CUSTOMIZED |

FIG. 6

METHOD AND SYSTEM FOR FIXING VIOLATION OF LAYOUT

PRIORITY CLAIM AND CROSS-REFERENCE

This application claims priority to China Application Serial Number 202011230270.3, filed Nov. 6, 2020, the entirety of which is herein incorporated by reference.

BACKGROUND

Design rule checking (DRC) violations of a layout pattern are fixed in manual ad-hoc analysis. Users solely rely on electronic design automation (EDA) tools to fix the violations. The violations are fixed using trial-and-error method. In order to obtain an overall picture of the violations and the layout pattern, violation types are checked one by one.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a lookup table 600 configured to be searched for a strategy to fix violations which are not associated with the routing congestions, in accordance with some embodiments of the present disclosure.

DETAILED DESCRIPTION

Figure 1:
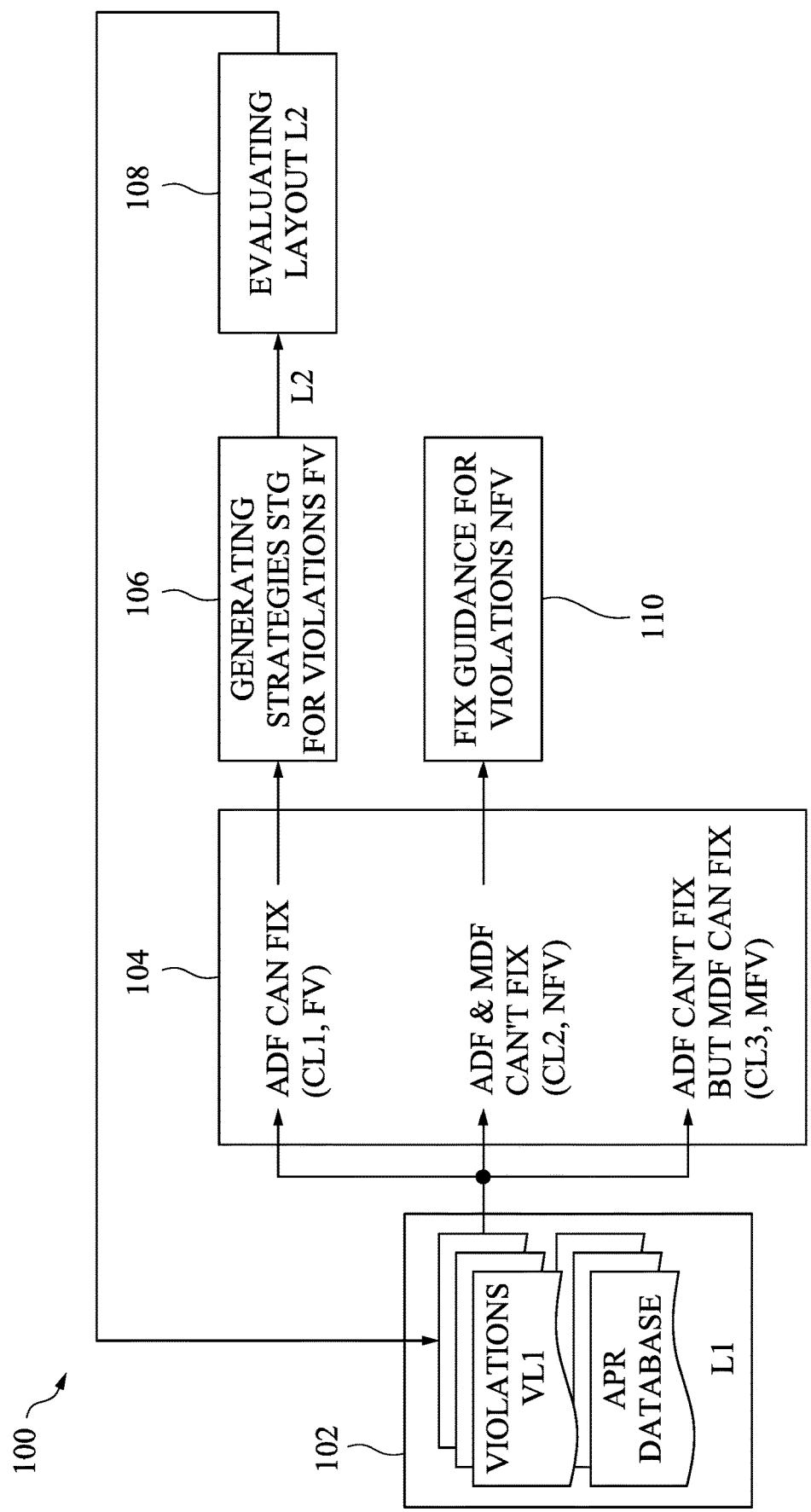
FIG. 1 is a flowchart of a method 100 of generating a layout in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a flowchart of a method 100 of generating a layout in accordance with some embodiments of the present disclosure. As illustratively shown in FIG. 1, the method 100 includes operations 102, 104, 106, 108 and 110. In some embodiments, the method 100 is performed to generate a layout L2 based on a layout L1. In some embodiments, the method 100 is implemented at an engineer change order (ECO) stage of a chip manufacturing process.

As illustratively shown in FIG. 1, at operation 102, design rule checking (DRC) violations VL1 and automatic placing and routing (APR) database associated with the layout L1 are received. In some embodiments, the DRC violations VL1 correspond to physical validation (PV) errors of the layout L1. Examples of PV errors include but are not limited to violations resulting from missing redundant vias, metal spacing violations, antenna violations, well spacing violations, metal geometry violations such as minimum area for a specific metal layer, and so on.

At operation 104, the DRC violations VL1 are classified into classes CL11-CL13 according to the chip features associated with the DRC violations VL1. As illustratively shown in FIG. 1, violations FV of the DRC violations VL1 which ADF (Auto route DRC Fix) is able to fix belong to the class CL11, violations NFV of the DRC violations VL1 which ADF and MDF (Manual DRC layout Fix) both are not able to fix belong to the class CL12, and violations MFV of the DRC violations VL1 which ADF is not able to fix but MDF is able to fix belong to the class CL13. In some embodiments, operations of the violations FV fixed by ADF correspond to operation 106 as will be discussed below.

At operation 106, multiple strategies STG are generated to fix the violations FV. Alternatively stated, a strategy STG is generated for a corresponding one of the violations FV. In some embodiments, the strategies STG are generated by selecting operations corresponding to the strategies STG from pre-stored operations which are stored in a memory (e.g., a memory 360 in FIG. 3). In some embodiments, the layout L2 is generated by applying the strategies STG to the layout L1 to fix the violations FV of the layout L1. In some embodiments, the strategies STG include operations of generating, removing, and/or modifying at least one chip feature of the layout L1.

At operation 108, the layout L2 is diagnosed or evaluated. In some embodiments, in operation 108, a reduce ratio of a corresponding one of violation types of the violations FV and a fix rate of the strategies STG that are associated with the layout L2 are evaluated. The reduce ratios depend on numbers of violations of a corresponding one of the violation types of the violations FV before and after applying the strategies STG. The fix rate depends on a number of the violations FV, a number of violations fixed by the strategies STG and a number of violations generated by the strategies STG. In some embodiments, the strategies STG are adjusted according to the reduce ratios and the fix rate. Further details of the reduce ratio and the fix rate are described below in embodiments with reference to FIG. 9.

In some embodiments, after operation 108, operations 102, 104, 106, 108 and 110 are repeated while a layout L2 is provided. For example, in operation 102, DRC violations and APR (Automatic Placing and Routing) database associated with the layout L2 are received, and the DRC violations associated with the layout L2 are classified to the classes CL11-CL13 in operation 104.

At operation 110, a fix guidance is generated according to the violations NVF. In some embodiments, the fix guidance includes an operation of fixing the violations NVF at stages earlier than the ECO stage.

Figure 2:
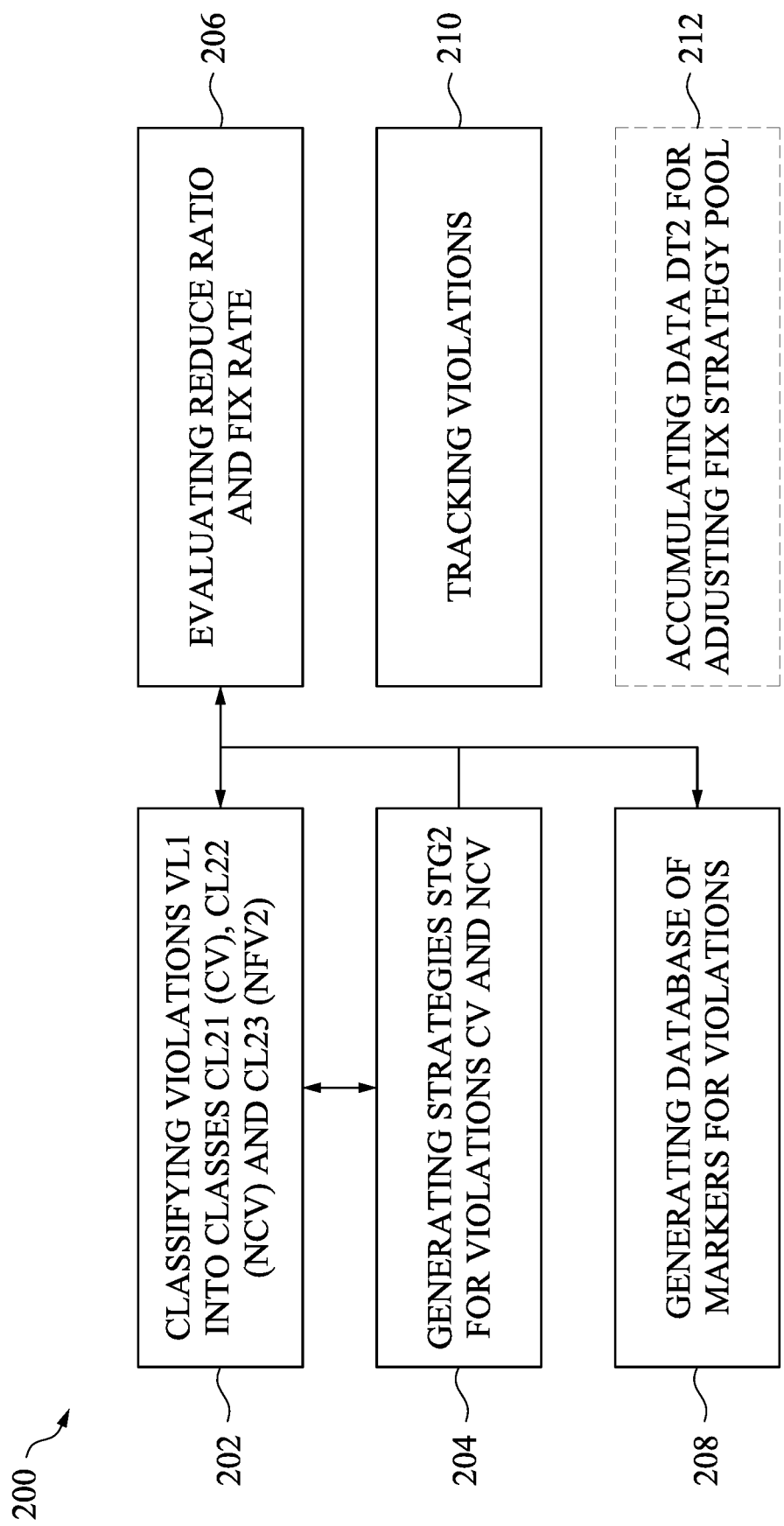
FIG. 2 is a flowchart of a method 200 of generating a layout in accordance with various embodiments of the present disclosure.

FIG. 2 is a flowchart of a method 200 of generating a layout in accordance with various embodiments of the present disclosure. As illustratively shown in FIG. 2, the method 200 includes operations 202, 204, 206, 208, 210 and 212. In some embodiments, the method 200 is performed to generate the layout L2 based on the layout L1 as illustrated in the method 100 of FIG. 1, and the method 200 includes more detailed operations than those of the method 100 of FIG. 1.

For illustration of FIG. 2 with reference to FIG. 1, at operation 202, the DRC violations VL1 are classified into classes CL21-CL23 according to the chip features of the layout L1 associated with the DRC violations VL1. In some embodiments, the classification includes generating a vector array for one of the DRC violations VL1 according to the chip features and classifying the one of the DRC violations VL1 into one of the three classes CL21-CL23 according to the vector array. In some further embodiments, each of the DRC violations VL1 has a corresponding vector array as a reference for the classification. In other words, the DRC violations VL1 are classified into the CL21-CL23 according to the corresponding vector arrays. In some embodiments, each of the parameters in the vector array corresponds to an aspect of the corresponding violation. For example, as illustratively shown in FIG. 6, a row R62 is a vector array corresponding to a violation V61. With reference to a row R61, the row R62 includes parameters of different levels corresponding to different aspects of the violation V61, including, for example, a violation type, a shape, an environment condition and a category of the violation V61.

Figure 3:
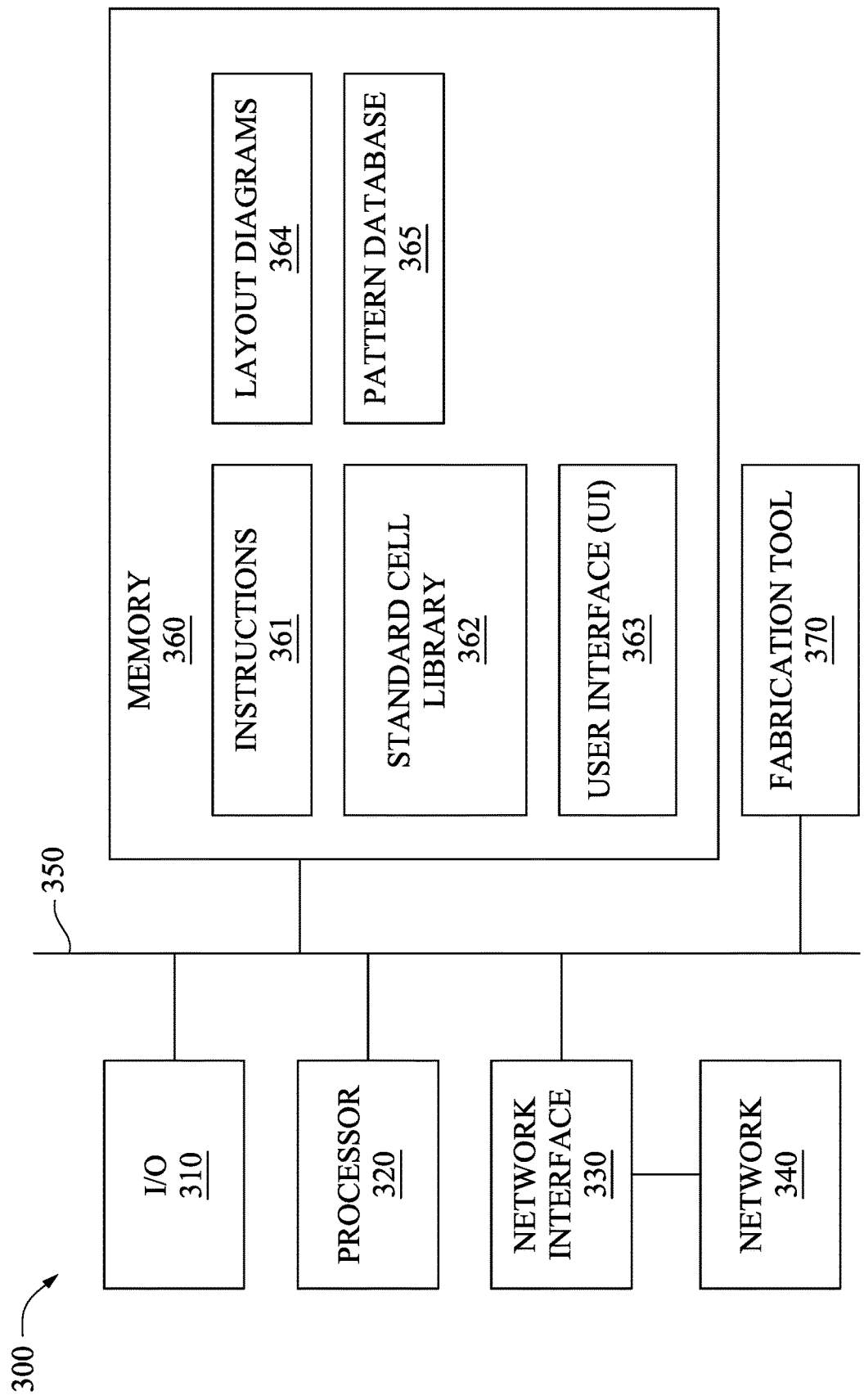
FIG. 3 is a block diagram of an electronic design automation (EDA) system 300 for designing the integrated circuit layout design, in accordance with some embodiments of the present disclosure.

In some embodiments, the classification is performed by a hardware of an electronic design automation (EDA) system, e.g, an EDA system 300 in FIG. 3. In some embodiments, the classification is performed by a processor which performs a classification algorithm to the DRC violations VL1. For example, as illustratively shown in FIG. 3 the classification is performed by a processor 320 of the EDA system 300 which implements the classification algorithm stored in a memory 360 of the EDA system 300. In some embodiments, the classification algorithm corresponds to the operations 104 and/or 202 as illustratively shown in FIG. 1 and/or FIG. 2.

In some embodiments, the class CL21 corresponds to violations CV of the DRC violations VL1 which are associated with routing congestions of the layout L1, the class CL22 corresponds to violations NCV of the DRC violations VL1 which are not associated with routing congestions, and the class CL23 corresponds to violations NFV2 of the DRC violations VL1 which are not fixable by ADF method 200. In some embodiments, the violations CV and NCV are selected from the violations FV in FIG. 1, and thus the violations CV and NCV correspond to ADF as illustrated in FIG. 1 and are able to be fixed by ADF. In some embodiments, the violations NFV2 correspond to the violations NFV and MFV which are unable to be fixed by ADF in FIG. 1.

In various embodiments, the violations NFV2 are identified from the DRC violations VL1 according to various conditions. In some embodiments, the conditions are related to input/output pins of the layout L1. For example, the conditions include a pin un-placement, a pin-to-pin space violation, a pin NDR (Non-Default Rule) width violation, a pin short violation, a pin which is not centered on a wire track, a pin which its pin location is out of a die boundary or a clock pin layer which is lower than a prefer minimum layer constrain. In some embodiments, the conditions are related to routing blockages of the layout L1. For example, the conditions include a violation or a short in a cluster area because a routing blockage occupying too many routing resources, a non-prefer routing pattern violation caused by a routing blockage occupying too many routing resources, a violation on a macro pin because a routing blockage block a pin access or a short with a routing blockage. In some embodiments, the conditions are related to a violation on a fixed metal shape.

At operation 204, strategies STG2 for fixing the violations CV and NCV are generated according to the chip features associated with the violations CV and NCV. In some embodiments, strategies STG2 are customized for the violations CV and NCV. In some embodiments, strategies STG2 are selected from a fix strategy pool stored in a memory. In some embodiments, the violations CV and NCV corresponding to different fix strategy pools. Therefore, for the violations CV, strategies STG2 only need to be selected from the fix strategy pool corresponding to the violations CV, and thus a time of selecting STG in the fix strategy pool corresponding to the violations NCV is saved. For illustration of FIG. 2 with reference to FIG. 1, the strategies STG2 are examples of the strategies STG as discussed above.

At operation 206, fix rates and reduce ratios associated with the violations CV, NCV and the strategies STG2 are evaluated. In some embodiments, violations associated with pin accesses are identified and fixed by strategies including operations selected from the pre-stored operations. Further details of the violations associated with pin accesses are described below in embodiments associate with FIG. 8A and FIG. 8B. In some embodiments, a reduce ratio of the strategies STG2 corresponding to a corresponding violation type of the violations CV, NCV are quantified at operation 206.

At operation 208, a database is generated according to corrections between APR and PV which are associated with the layout L1, markers made on fixable violations of the DRC violations VL1, and violations which are newly created or remained after the strategies STG2 is performed. In some embodiments, the database is a Calibre result database (RDB).

At operation 210, violations of different layouts are tracked. For example, an engineering change order (ECO) DRC tracking is performed to track numbers of violations of different layouts, including, for example, the layouts L1 and L2.

At operation 212, data DT2 associated with patterns and surrounding environment of the DRC violations VL1 is accumulated for adjusting the fix strategy pool. In some embodiments, proper strategies for violations that are not stored in the strategy pools of the method 200 are predicted and generated according to the violations CV, NCV and the strategies STG2.

FIG. 3 is a block diagram of an electronic design automation (EDA) system 300 for designing the integrated circuit layout design, in accordance with some embodiments of the present disclosure. The EDA system 300 is configured to implement one or more operations of the method 100 disclosed in FIG. 1 and the method 200 disclosed in FIG. 2. In some embodiments, the EDA system 300 includes an APR system.

In some embodiments, the EDA system 300 is a general purpose computing device including a hardware processor 320 and a non-transitory, computer-readable storage medium 360. The storage medium 360, amongst other things, is encoded with, i.e., stores, computer program code (instructions) 361, i.e., a set of executable instructions. Execution of the instructions 361 by the hardware processor 320 represents (at least in part) an EDA tool which implements a portion or all of methods including, for example, the method 100 and/or the method 200.

The processor 320 is electrically coupled to the computer-readable storage medium 360 via a bus 350. The processor 320 is also electrically coupled to an I/O interface 310 and a fabrication tool 370 by the bus 350. A network interface 330 is also electrically connected to the processor 320 via the bus 350. The network interface 330 is connected to a network 340, and thus that the processor 320 and the computer-readable storage medium 360 are capable of connecting to external elements via the network 340. The processor 320 is configured to execute the computer program code 361 encoded in the computer-readable storage medium 360 in order to cause the EDA system 300 to be usable for performing a portion or all of the noted processes and/or methods. In one or more embodiments, the processor 320 is a central processing unit (CPU), a multi-processor, a distributed processing system, an application specific integrated circuit (ASIC), and/or a suitable processing unit.

In one or more embodiments, the computer-readable storage medium 360 is an electronic, magnetic, optical, electromagnetic, infrared, and/or a semiconductor system (or apparatus or device). For example, the computer-readable storage medium 360 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer-readable storage medium 360 includes a compact disk-read only memory (CD-ROM), a compact disk-read/write (CD-R/W), and/or a digital video disc (DVD).

In one or more embodiments, the storage medium 360 stores the computer program code 361 configured to cause the EDA system 300 (where such execution represents (at least in part) the EDA tool) to be usable for performing a portion or all of the noted processes and/or methods. In one or more embodiments, the storage medium 360 also stores information which facilitates performing a portion or all of the noted processes and/or methods. In one or more embodiments, the storage medium 360 stores a library 362 of standard cells including such standard cells as disclosed herein, for example, a cell including a routing block 716 discussed below with respect to FIG. 7 or a cell including active areas AA1-AA4 discussed below with respect to FIG. 10.

In one or more embodiments, the storage medium 360 stores layout diagrams 364 which, for example, correspond to the layouts L1 and L2. In one or more embodiments, the storage medium 360 stores a pattern data farm 365 configured to accumulate the data DT2 associated with patterns and surrounding environment of the DRC violations VL1 corresponding to the operation 212 illustratively shown in FIG. 2. In some embodiments, the pattern data farm 365 is configured to form a big-data database to improve strategy designs. In some embodiments, the pattern data farm 365 is configured to perform at least one test on the data DT2 to identify rooms to improvement. In some embodiments, the pattern data farm 365 is configured to extract chip features including, for example, numerical and image based attributes, of the layout L1 and L2 from the data DT2.

In one or more embodiments, the storage medium 360 is a memory which store computer program codes. The computer program codes correspond to the operations described above in FIG. 1 and FIG. 2 and configured to be executed by the processor 320. In one or more embodiments, the processor 320 is configured to execute the computer program codes in the memory to: categorize design rule violations (e.g., the DRC violations VL1) into predefined categories (e.g., the classes CL11-CL13) according to data (e.g., data included in the lookup table 600 in FIG. 6) of the design rule violations of a first layout (e.g., the layout L1) of a chip, automatically assign first operations (e.g., operations correspond to one of blocks in a column C67 of the lookup table 600) of pre-stored operations (e.g., operations correspond to the blocks in the column C67) to each of the design rule violations according to the data of the design rule violations of the first layout and generate a second layout (e.g., the layout L2) based on the first layout and the first operations.

The EDA system 300 includes a I/O interface 310. The I/O interface 310 is coupled to external circuitry. In one or more embodiments, The I/O interface 310 includes a keyboard, keypad, mouse, trackball, trackpad, touchscreen, and/or cursor direction keys for communicating information and commands to the processor 320.

The EDA system 300 also includes the network interface 330 coupled to the processor 320. The network interface 330 allows the EDA system 300 to communicate with the network 340, to which one or more other computer systems are connected. The network interface 330 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods including, for example, the method 100 and/or the method 200, is implemented in two or more systems including the EDA system 300.

The EDA system 300 also includes the fabrication tool 370 coupled to the processor 320. The fabrication tool 370 is configured to fabricate chips corresponding to layouts, including, for example, the layouts L2, L82a, L82b illustrated in FIG. 1, FIG. 8A and FIG. 8B, based on the design files processed by the processor 320 and/or the IC layout designs as discussed above.

The EDA system 300 is configured to receive information through the I/O interface 310. The information received through the I/O interface 310 includes one or more of instructions, data, design rules, libraries of standard cells, and/or other parameters for processing by the processor 320. The information is transferred to the processor 320 via the bus 350. The EDA system 300 is configured to receive information related to a UI through the I/O interface 310. The information is stored in the computer-readable medium 360 as a user interface (UI) 363.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 4:
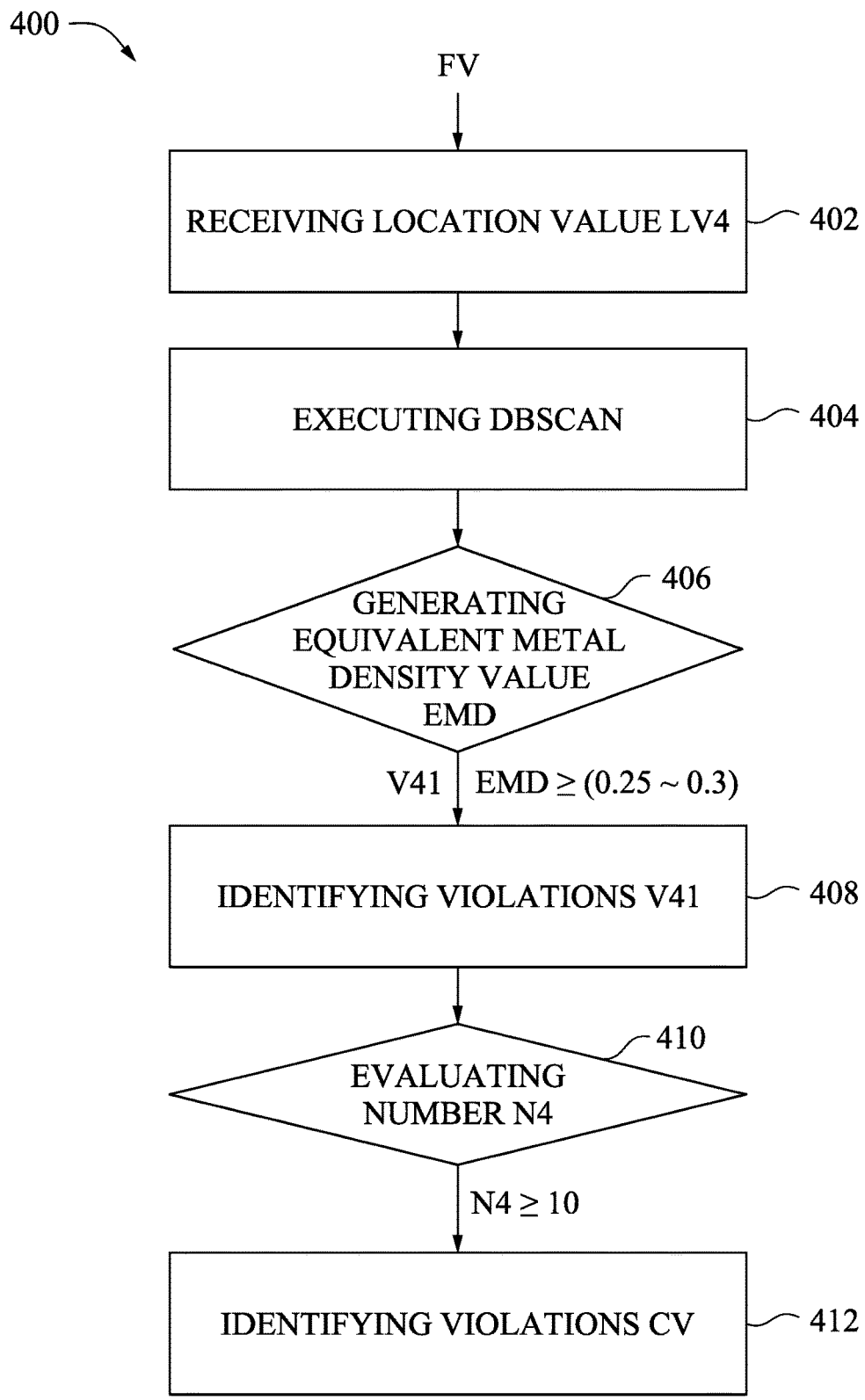
FIG. 4 is a flowchart of a method of identifying violations corresponding to routing congestions, in accordance with some embodiments of the present disclosure.

FIG. 4 is a flowchart of a method 400 of identifying violations corresponding to routing congestions, in accordance with some embodiments of the present disclosure. As illustratively shown in FIG. 4, the method 400 includes operations 402, 404, 406, 408, 410 and 412. In some embodiments, the method 400 is performed to identify the violation CV corresponding to routing congestions from the violations FV of the layout L1 in FIG. 1. In some embodiments, violations associated with the routing congestions are located in corresponding cluster box areas including, for example, cluster box areas associated with the operation 410.

At operation 402, a location value LV4 of a corresponding one of the violations FV is received. Alternatively stated, multiple location values LV4 of the violations FV are received. In some embodiments, one of the violations FV is generated on a layer LY of the layout L1. Alternatively stated, the violations FV are generated on multiple layers LY of the layout L1, correspondingly. In some embodiments, the layer LY of the one of the violations FV is identified according to the location value LV4 of the one of the violations FV.

At operation 404, a DBSCAN (Density-based spatial clustering of applications with noise) algorithm is executed according to the location values LV4 and chip features associated with the violations FV. In some embodiments, the DBSCAN algorithm is performed to identify cluster box areas of the layout L1.

At operation 406, an equivalent-metal density value EMD associated with the violations FV is generated. In some embodiments, the equivalent-metal density values EMD is defined by $EMD = \Sigma_{LY1 \in LY} RT(LY1) \times MD(LY1)$, in which a layer LY1 is one of the layers LY, ratio RT(LY1) is the ratio of a number of violations on the layer LY1 to a total number of the DRC violations VL1 of the layout L1, and a metal density MD(LY1) is the metal density of the layer LY1.

At operation 408, violations V41 are identified from the violations FV according to the equivalent metal density value EMD. In some embodiments, the violations V41 are identified when the equivalent-metal density value EMD meets filtering criteria. As illustratively shown in FIG. 4, the filtering criteria include that the equivalent-metal density value EMD is larger than or equal to a value ranged in 0.25-0.3. In some embodiments, the violations V41 are considered as cluster candidates of the layout L1.

At operation 410, the violations V41 are processed by a cluster box filter. In some embodiments, the cluster box filter evaluates a number N4 of violations in a cluster box area around a corresponding one of the violations V41. Alternatively stated, multiple numbers N4 in cluster box areas around corresponding ones of the violations V41 are evaluated. In some embodiments, each of the cluster box areas has a size larger than or equal to 1.0 µm×1.0 µm.

At operation 412, the violations CV are identified from the violations V41 according to the numbers N4 of the violations V41. In some embodiments, the violations CV are identified when the numbers N4 are larger than or equal to ten. In some embodiments, the cluster box areas with the numbers N4 larger than or equal to ten are considered as valid cluster boxes. The violations CV corresponds to the routing congestions when the violations CV located in the valid cluster boxes.

Figure 5:
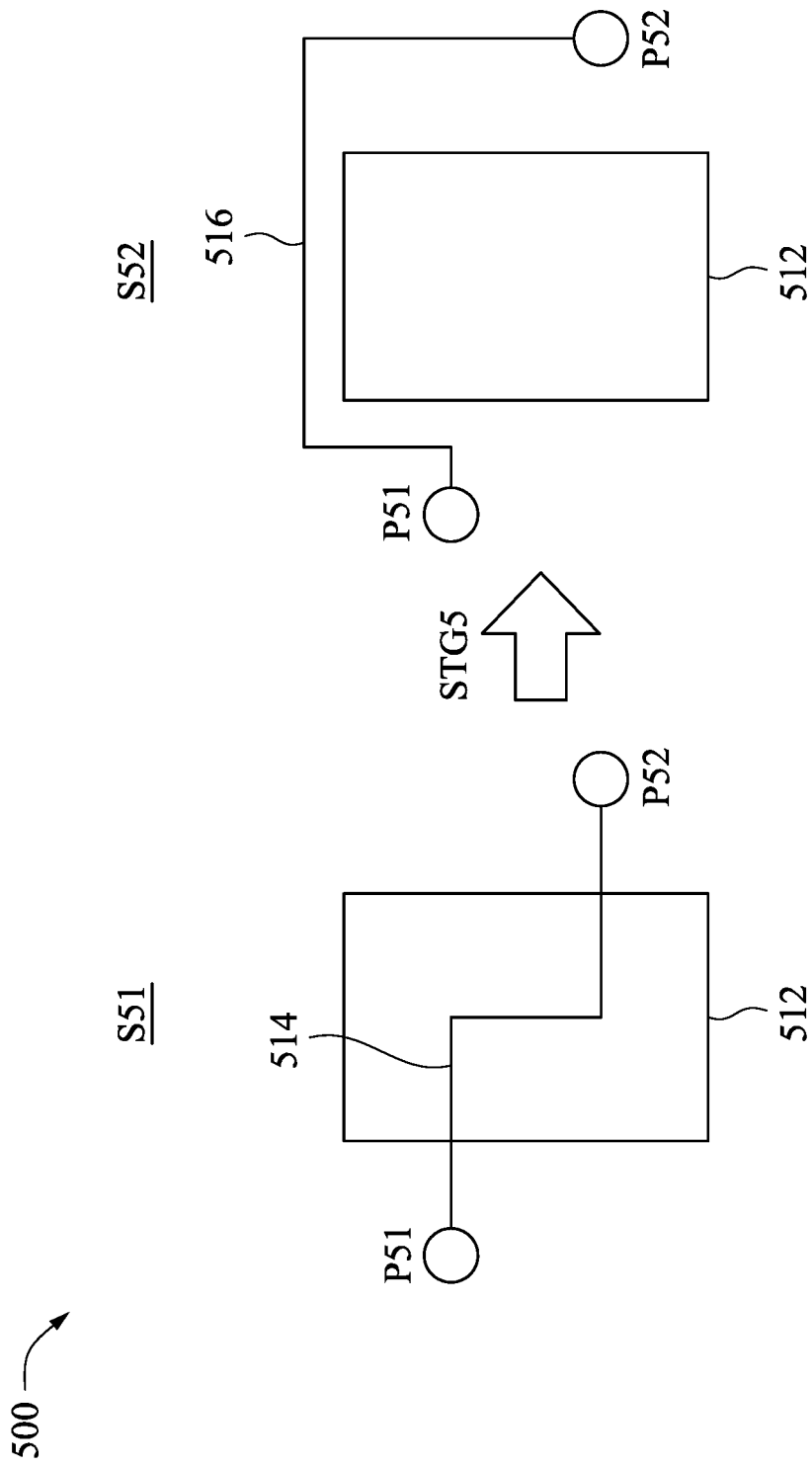
FIG. 5 is a diagram 500 of fixing a violation corresponding to the routing congestions, in accordance with some embodiments of the present disclosure.

FIG. 5 is a diagram 500 of fixing a violation corresponding to the routing congestions, in accordance with some embodiments of the present disclosure. As illustratively shown in FIG. 5, the diagram 500 includes state S51 and state S52 of a layout. A violation V51 associated with the routing congestions, which is shown in the state S51, is fixed, and thus the routing is modified, which is shown in the state S52. In some embodiments, the violation V51 is one of the violations CV corresponding to the operation 412 illustratively shown in FIG. 4.

At state S51, a wire 514 which passes through a congestion region 512 to connect points P51 and P52 is detected as the violation V51. Thus, a corresponding strategy STG5 is generated to fix the violation V51. In some embodiments, the strategy STG5 includes an operation of guiding the wire 514 to bypass the congestion region 512.

At state S52, a wire 516 connects points P51 and P52 and does not pass through the congestion region 512. Furthermore, in some embodiments, the wire 516 is not contact with the congestion region 512. Therefore, the violation V51 is fixed by replacing the wire 514 by the wire 516 according to the strategy STG5.

Strategies for fixing violations associated with the routing congestions are not limited by the strategy STG5. For example, in some other embodiments, the strategies include relocating buffers associated with a congestion region to alleviate the congestion region which, for example, corresponds to congestion region 512.

Figure 9:
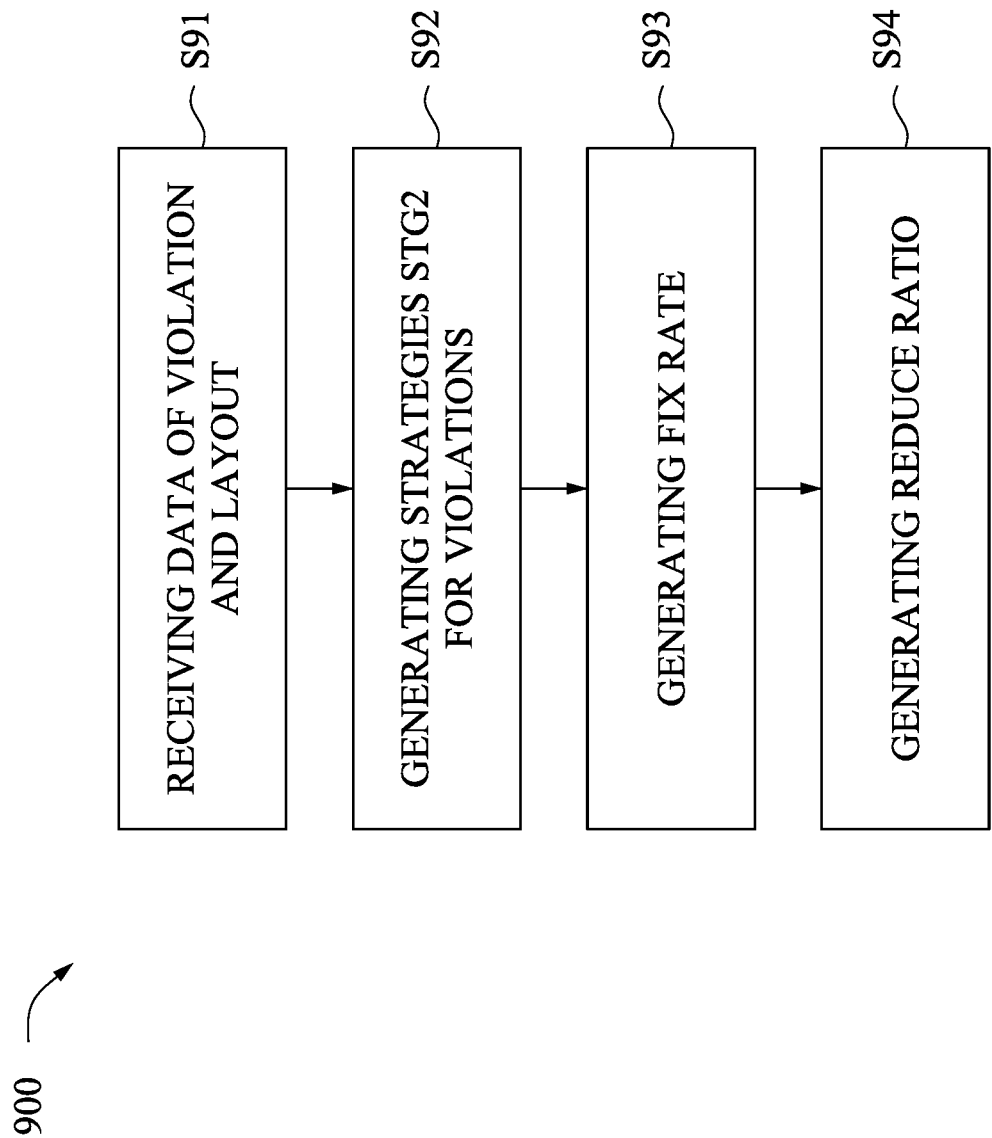
FIG. 9 is a flowchart of a method 900 of generating and evaluating fix strategies corresponding to violations of a layout, in accordance with some embodiments of the present disclosure.

FIG. 6 is a lookup table 600 configured to be searched for a strategy to fix violations which are not associated with the routing congestions, in accordance with some embodiments of the present disclosure. In some embodiments, the lookup table 600 corresponds to the operation 106 in FIG. 1 and/or the operation 204 in FIG. 2 which correspond to generating strategies for fixing violations. In some embodiments, contents in the lookup table 600 are obtained by operations S91 and S92 of a method 900 as illustrated in FIG. 9 which will be discussed in more detail below.

As illustratively shown in FIG. 6, the lookup table 600 includes rows R61-R66 and columns C61-C67. The row R61 contains descriptions corresponding to the columns C61-C67. One of the rows R62-R66 corresponds to one of the violations NCV of the DRC violations VL1 which is not associated with the routing congestions as illustratively shown in FIG. 2. Alternatively stated, the five rows R62-R66 correspond to five violations of the violations NCV which are not associated with the routing congestions.

As descriptions shown in row R61 of FIG. 6, the column C61 corresponds to technology nodes of manufacturing processes of the violations, for example, the technology nodes n6, n7 and n22.

As illustratively shown in FIG. 6, the columns C62-C66 correspond to classification conditions of the violations NCV. The column C62 corresponds to violation types of the violations with rule name only. The column C63 corresponds to the violation types of the violations with some interpretation. For example, the violation types correspond to an antenna violation, cut spacing and a metal short. The column C64 corresponds to shapes of the violations. For example, the shapes correspond to operation signals only, clock signals only and the operation signals to the clock signals. In some embodiments, the operation signals include but are not limit to control signals and data signals of a chip corresponding to the lookup table 600. The column C65 corresponds to ambient environments associated with the violations NCV. For example, the ambient environments of the violations correspond to a fat pin, a local congestion and a violation under a macro. The column C66 corresponds to categories of the violations. For example, the categories of the violations correspond to a short issue, a pin access issue, a bad via issue and other circuit issues. In summary, the columns C62-C66 are the classification conditions corresponding to structure features, environment features, violation types or circuit issues of the violations NCV of the layout L1.

As illustratively shown in FIG. 6, the column C67 corresponds to strategies generated according the classification conditions in the columns C62-C66 of the violations NCV. In some embodiments, the generation of the strategies includes selecting operations from pre-stored operations. For example, violation conditions of a violation V61 is illustrated by blocks at intersections of the row R62 and the columns C62-C66. According to the blocks of the row R62, a violation type of the violation V61 corresponds to an adjacent cut of a same mask spacing, a shape of the violation V61 corresponds to the operation signals only, an ambient environment of the violation V61 corresponds to that the violation V61 is blocked by a poly gate (PG), and a category of the violation V61 corresponds to a short issue. Therefore, according to the violation conditions associated with the violation V61 as discussed above, a corresponding strategy of moving a cell is generated, which is illustrated at an intersection of the column C67 and the row R62. In some embodiments, the strategy is selected from the fix strategy pools described in the method 200 of FIG. 2.

Figure 7:
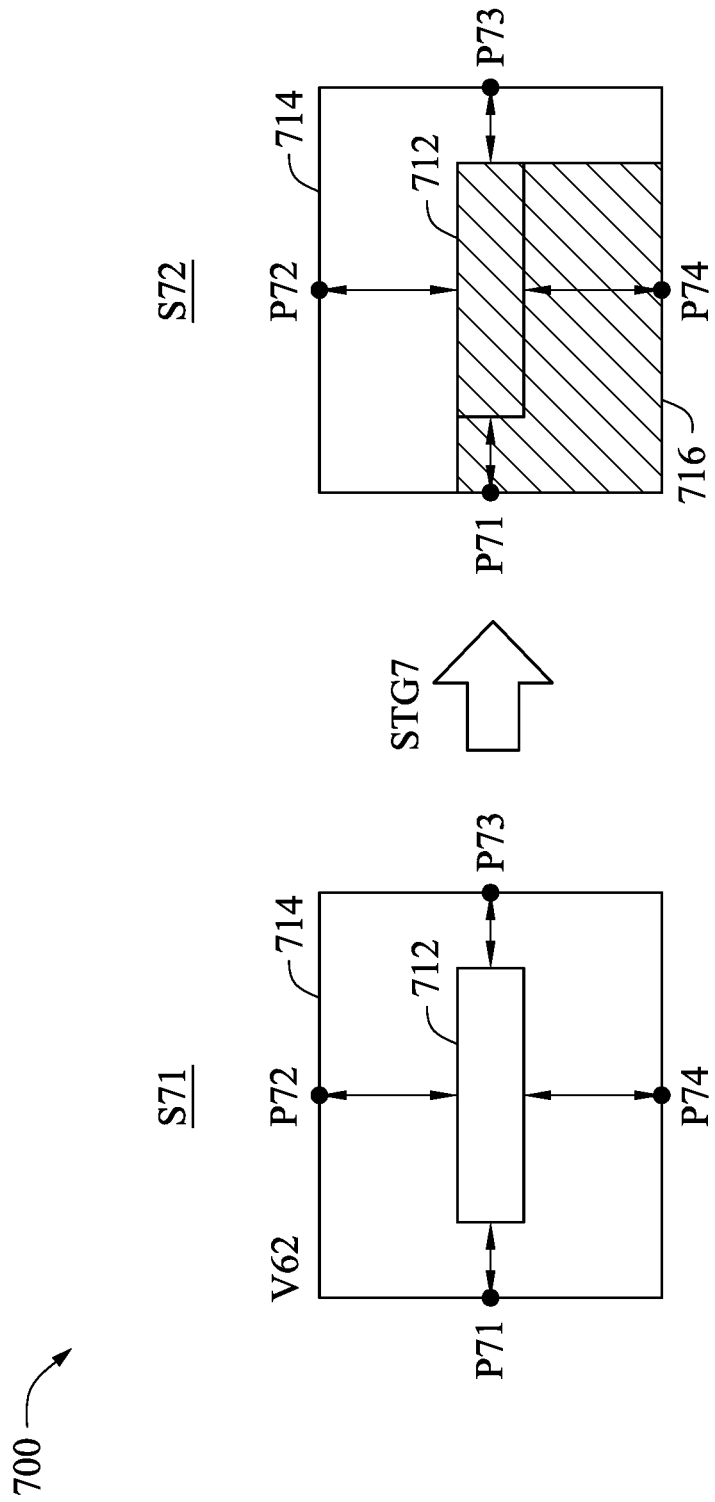
FIG. 7 is a diagram 700 of adding a routing block, in accordance with some embodiments of the present disclosure.

FIG. 7 is a diagram 700 of adding a routing block, in accordance with some embodiments of the present disclosure. As illustratively shown in FIG. 7, diagram 700 includes states S71 and S72. For illustration of FIG. 7 with reference to FIG. 6, the strategy STG7 of adding a routing block which corresponds to the violation V62 of the row R63 is described in further detail following. The violation V62 which is shown in the state S71, need to be fixed by adding a routing block 716, and thus the routing block 716 is added in the state S72.

As illustratively shown in FIG. 7, at state S71, the strategy STG7 is generated for fixing the violation V62. A marker 712 labels a location of the violation V62. Edges of a region 714 are extended to points P71-P74. In some embodiments, the marker is made at operation 208 as illustrated in FIG. 2.

At state S72, a routing block 716 is added in the region 714 and covers the marker 712. As illustratively shown in FIG. 7, edges of the routing block 716 are extended to the points P71, P74 and the edges of the region 714. In some embodiments, shapes and vias in the region 714 are removed according to the strategy STG7.

Figure 8A:
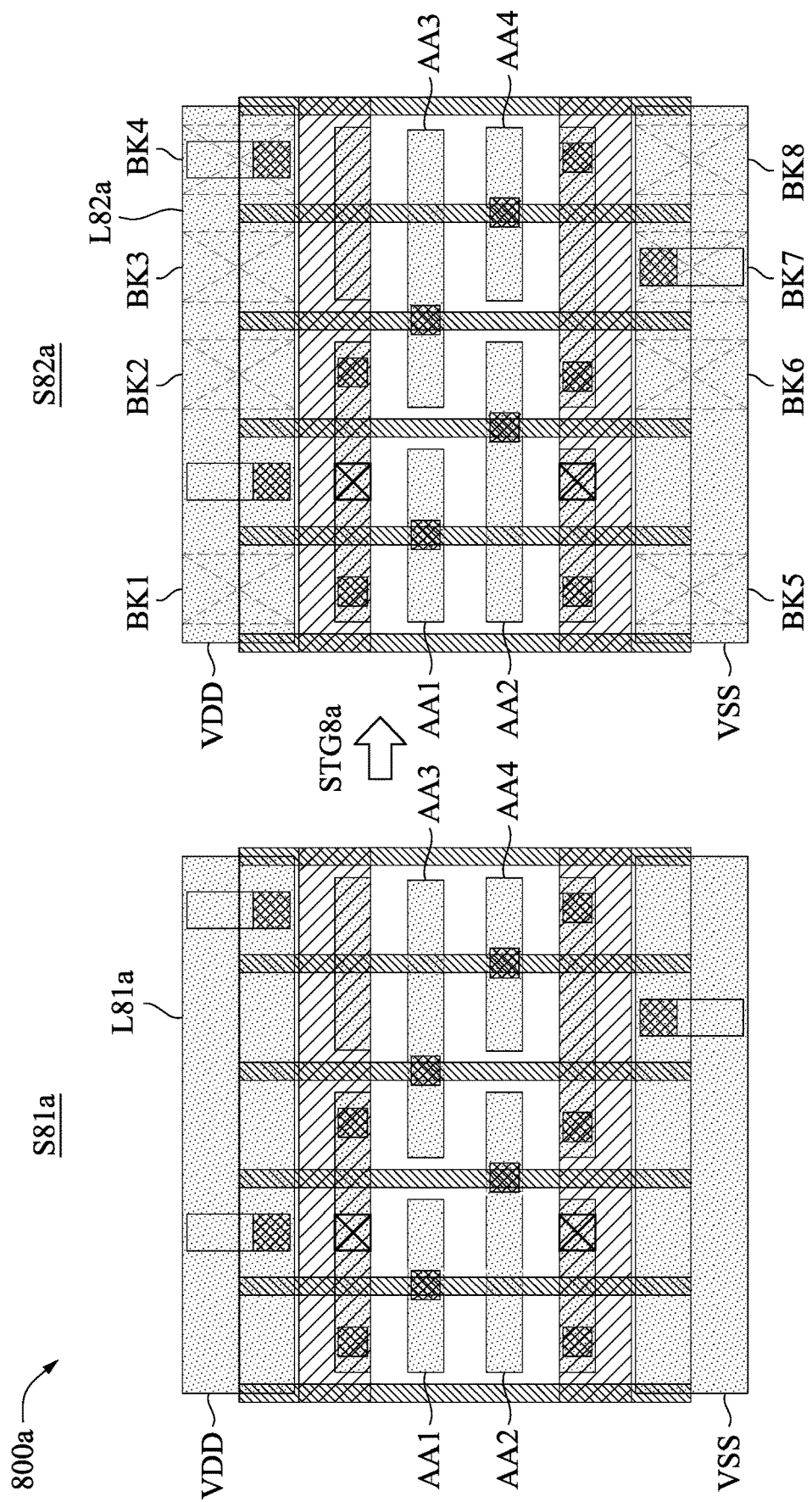
FIG. 8A is a diagram 800a of fixing a violation associated with pin accesses, in accordance with some embodiments of the present disclosure.

FIG. 8A is a diagram 800a of fixing a violation associated with pin accesses, in accordance with some embodiments of the present disclosure. As illustratively shown in FIG. 8A, a diagram 800a includes states S81a and S82a. Layouts L81a and L82a correspond to the states S81a and S82a, respectively. In some embodiments, the diagram 800a corresponds to fixing a violation of a short issue associated with pin accesses of the layout L81a. The violation of the short issue is fixed in the layout L82a. In some embodiments, operations corresponding to the diagram 800a correspond to the operation 106 in FIG. 1 and/or the operation 204 in FIG. 2.

As illustratively shown in FIG. 8A, the layout L81a is modified to generate the layout L82a according to a strategy STG8a. In some embodiments, the strategy STG8a is generated according to the layout L81a for fixing a short issue associated with pin accesses of the layout L81a.

As illustratively shown in FIG. 8A, both of the layouts L81a and L82a include power lines VDD, VSS and active areas AA1-AA4. Comparing with the layout L81a, the layout L82a further includes blockages BK1-BK8.

At state S81a, the active areas AA1-AA4 are configured to operate as pin accesses of the layout L81a. A short issue associated with the active areas AA1 and AA2 is detected, and the strategy STG8a is generated accordingly.

At state S82a, the blockages BK1-BK8 are generated to fix the short issue according to the strategy STG8a. The Layout L82a is generated by the method 800a according to a violation of the layout L81a associated with the short issue and the strategy STG8a. In some embodiments, the blockages BK1-BK8 block other components on the layout L81a from contacting the power lines VDD, VSS and the active areas AA1-AA4, thus the short issue is avoided.

Figure 8B:
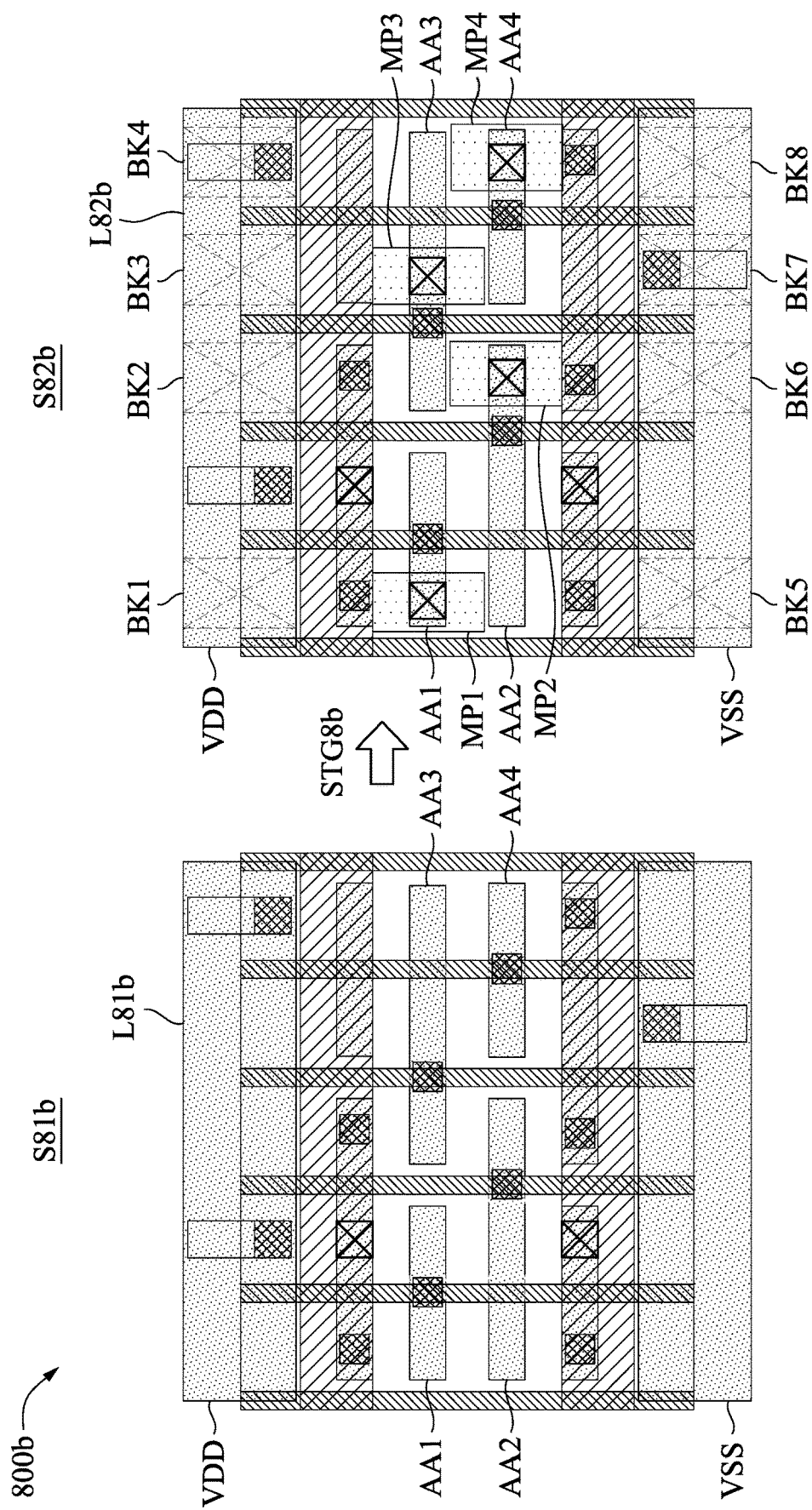
FIG. 8B is a diagram 800b of fixing a violation associated with pin accesses, in accordance with some embodiments of the present disclosure.

FIG. 8B is a diagram 800b of fixing a violation associated with pin accesses, in accordance with some embodiments of the present disclosure. As illustratively shown in FIG. 8B, a diagram 800b includes states S81b and S82b. Layouts L81b and L82b correspond to the states S81b and S82b, respectively. In some embodiments, the diagram 800b corresponds to fixing a violation of a short issue associated with pin accesses of the layout L81b. The violation of the short issue is fixed in the layout L82b. In some embodiments, the operations corresponding to the diagram 800b correspond to the operation 106 in FIG. 1 and/or the operation 204 in FIG. 2.

As illustratively shown in FIG. 8B, the layout L81b is modified to generate the layout L82b according to a strategy STG8b. In some embodiments, the strategy STG8b is generated according to the layout L81b to fix a short issue. The layouts L81b and L82b in FIG. 8B have similar structures with the layouts L81a and L82a in FIG. 8A, thus FIG. 8B follows a similar labeling convention to that of FIG. 8A.

As illustratively shown in FIG. 8B, both of the layouts L81b and L82b include power lines VDD, VSS and active areas AA1-AA4. Comparing with the layout L81b, the layout L82b further includes pin blocks MP1-MP4. In some embodiments, the pin blocks MP1-MP4 and the active areas AA1-AA4 are in different layers of the layout L82b. For example, the active areas AA1-AA4 are in a metal-zero (M0) layer of the layout L82b and the pin blocks MP1-MP4 are in a metal-one (M1) layer of the layout L82b.

At state S81b, the active areas AA1-AA4 are configured to operate as pin accesses of the layout L81b. A short issue associated with the active areas AA3 and AA2 is detected, and the strategy STG8b is generated accordingly.

At state S82b, according to the strategy STG8b, the pin blocks MP1-MP4 are generated to operate as pin accesses of the layout L82b, and the active areas AA1-AA4 are not configured to operate as the pin accesses of the layout L82b, thus the short issue is fixed. The Layout L82b is generated by the method 800b according to a violation of the layout L81b associated with the short issue and the strategy STG8b.

FIG. 9 is a flowchart of a method 900 of generating and evaluating fix strategies corresponding to violations of a layout, in accordance with some embodiments of the present disclosure. As illustratively shown in FIG. 9, a method 900 includes operations S91-S94. In following description, references are made to FIG. 1, FIG. 2 and FIG. 6 for illustration purpose and not limiting. In some embodiments, the method 900 corresponds to the operation 108 in FIG. 1 and/or the operation 206 in FIG. 2.

At operation S91, data associated with the DRC violations VL1 of the layout L1 are received and analyzed to obtain the corresponding classification conditions such as the violation types, the shapes, the ambient environments and the categories of the DRC violations VL1 as illustrated in FIG. 6.

At operation S92, according to the data associated with the DRC violations VL1, strategies STG are generated for fixing the violations FV which ADF is able to fix. In some embodiments, the violations FV, the violations NFV which ADF and MDF both are not able to fix and the violations MFV which ADF is not able to fix but MDF is able to fix are identified from the DRC violations VL1 at operation S92.

At operation S93, a fix rate FR of the strategies STG is generated. In some embodiments, the fix rate FR is associated with numbers N91-N93. The number N91 is a number of the violations FV of the layout L1. The number N92 is a number of violations fixed by the strategies STG. The number N93 is a number of violations generated after the strategies STG is applied to the layout L1. For example, the fix rate FR is equal to (N91−N92+N93)/N91.

At operation S94, a reduce ratio RR of a corresponding one of the violation types is generated. Alternatively stated, multiple reduce ratios RR are generated corresponding to each of the violation types. In some embodiments, a reduce ratio RR1 of one of the violation types is associated with numbers N94 and N95. The number N94 is a number of violations of the one of the violation types before the strategies STG are applied to the layout L1. The number N95 is a number of violations of the one of the violation types after the strategies STG is applied to the layout L1. For example, the reduce ratio RR1 is equal to 1−(N95/N94).

In some embodiments, at least one of the methods 100, 200, 400, 500, 700, 800a, 800b and 900 described above is implemented by the EDA system 300 in FIG. 3.

Figure 10:
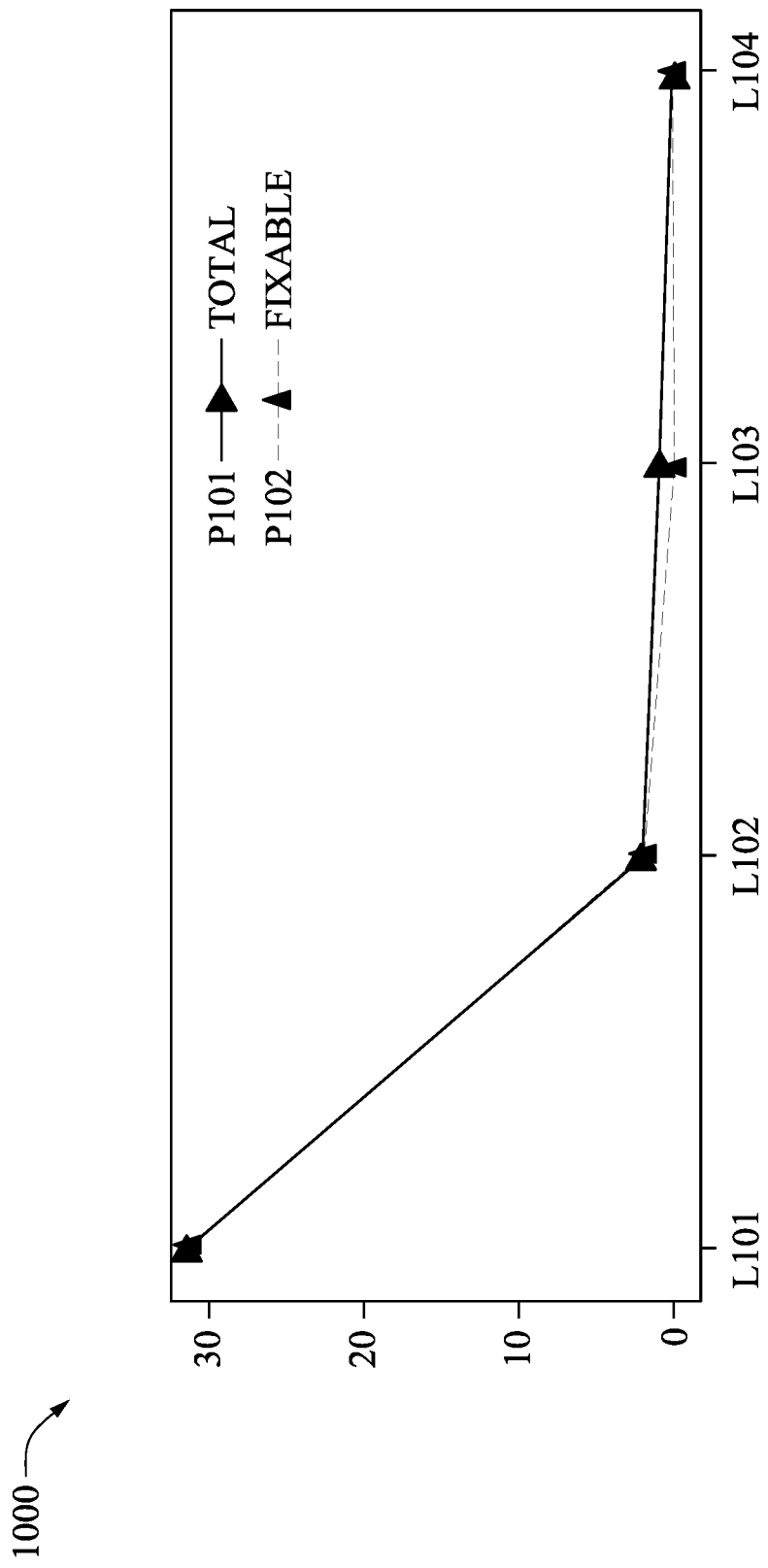
FIG. 10 is a schematic diagram of numbers of violations corresponding to different layouts, in accordance with some embodiments of the present disclosure.

FIG. 10 is a schematic diagram of numbers of violations corresponding to different layouts, in accordance with some embodiments of the present disclosure. As illustratively shown in FIG. 10, a diagram 1000 includes a horizontal axis corresponding to layouts L101-L104 and a vertical axis corresponding to numbers of total violations and fixable violations of corresponding ones of the layouts L101-L104. For example, the diagram 1000 illustrates that the number of total violations and the number of fixable violations of the layout L101 are both larger than 30. For example, the diagram 1000 illustrates that the number of total violations of the layout L103 is larger than the number of fixable violations of the layout L103.

As illustratively shown in FIG. 10, points P101 correspond to numbers of total violations including, for example, the DRC violations VL1 in FIG. 1, of the layouts L101-L104. Points P102 correspond to numbers of fixable violations including, for example, the violations FV in FIG. 1, which can be fixed automatically by ADF of the layouts L101-L104.

In some embodiments, the layout L102 is generated by modifying the layout L101 by at least one of the methods 100, 200, 400, 500, 700, 800a, 800b and 900 for fixing violations as described above. Thus, the number of the total violations and the number of the fixable violations of the layout L102 are smaller than that of the layout L101. Similarly, in some embodiments, the layout L103 is generated by modifying the layout L102, and the layout L104 is generated by modifying the layout L103.

In some embodiments, the total violations correspond to the DRC violations VL1 in FIG. 1, and the fixable violations correspond to the violations FV in FIG. 1. In some embodiments, the layout L101 corresponds to the layout L1 and the layout L102 corresponds to the layout L2 which generated by modifying the layout L1 with the method 100 in FIG. 1.

As illustratively shown in FIG. 10, at layout L103, the number of the total violations is larger than the number of the fixable violations, which means the layout L103 having at least one violation which is not fixable by ADF, and thus need to be fixed manually.

Figure 11:
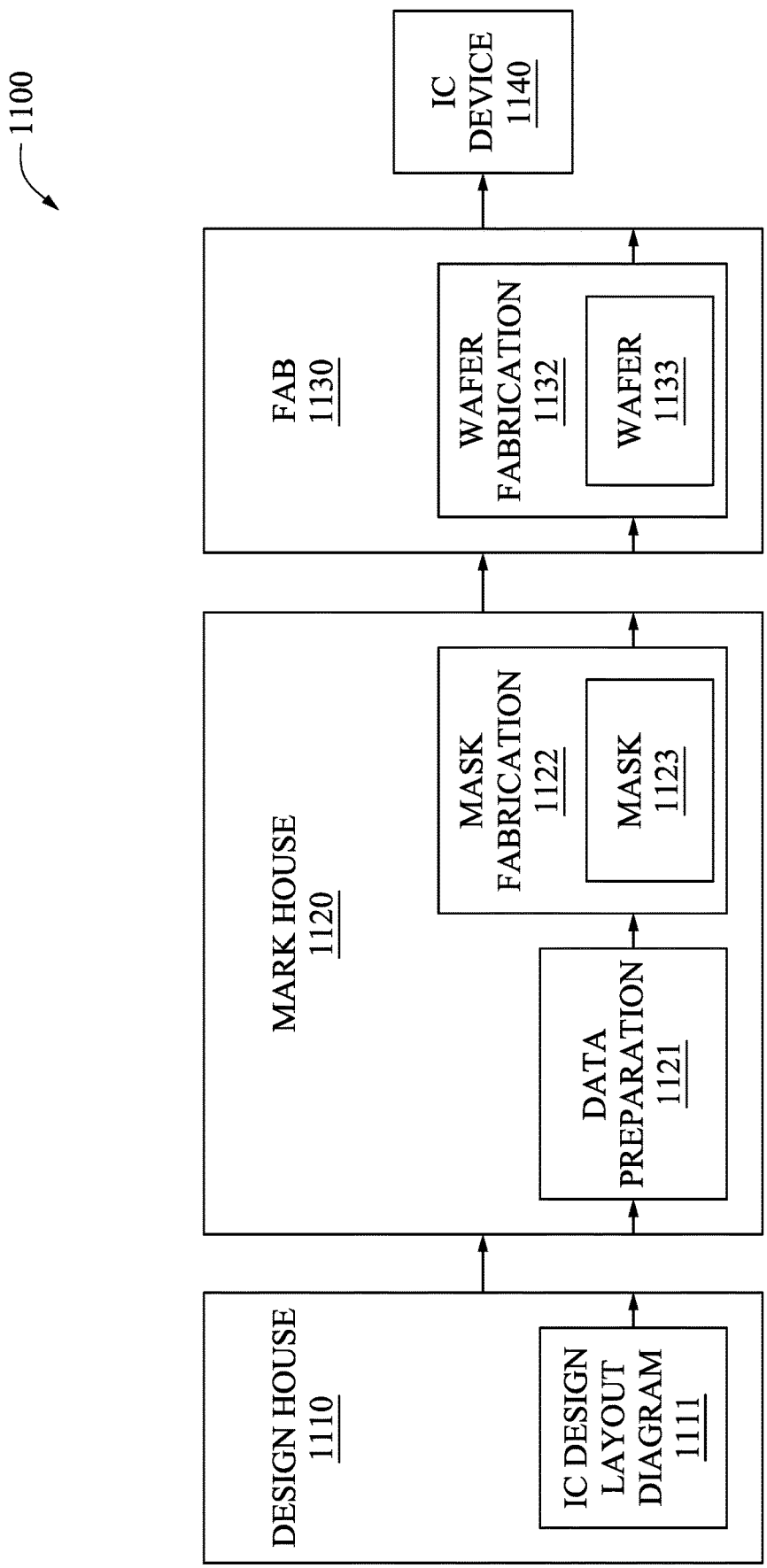
FIG. 11 is a block diagram of an integrated circuit manufacturing system, and an integrated circuit manufacturing flow associated therewith, in accordance with some embodiments.

In FIG. 11, an IC manufacturing system 1100 includes entities, such as a design house 1110, a mask house 1120, and an IC manufacturer/fabricator ("fab") 1130, that interact with one another in the design, development, and manufacturing cycles and/or services related to manufacturing an IC device 1140. The entities in the IC manufacturing system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 1110, the mask house 1120, and the IC fab 1130 is owned by a single larger company. In some embodiments, two or more of the design house 1110, the mask house 1120, and the IC fab 1130 coexist in a common facility and use common resources.

The design house (or design team) 1110 generates an IC design layout diagram 1111. The IC design layout diagram 1111 includes various geometrical patterns, for example, an IC layout design depicted in FIG. 8A and/or FIG. 8B discussed above. The geometrical patterns correspond to patterns of metal, oxide, or semiconductor layers that make up the various components of the IC device 1140 to be fabricated. The various layers combine to form various IC features. For example, a portion of the IC design layout diagram 1111 includes various IC features, such as an active region, gate electrode, source and drain, conductive segments or vias of an interlayer interconnection, to be formed in a semiconductor substrate (such as a silicon wafer) and various material layers disposed on the semiconductor substrate. The design house 1110 implements a proper design procedure to form the IC design layout diagram 1111. The design procedure includes one or more of logic design, physical design or place and route. The IC design layout diagram 1111 is presented in one or more data files having information of the geometrical patterns. For example, the IC design layout diagram 1111 is able to be expressed in a GDSII file format or DFII file format.

The mask house 1120 includes data preparation 1121 and mask fabrication 1122. The mask house 1120 uses the IC design layout diagram 1111 to manufacture one or more masks 1123 to be used for fabricating the various layers of the IC device 1140 according to the IC design layout diagram 1111. The mask house 1120 performs the mask data preparation 1121, where the IC design layout diagram 1111 is translated into a representative data file ("RDF"). The mask data preparation 1121 provides the RDF to the mask fabrication 1122. The mask fabrication 1122 includes a mask writer. A mask writer converts the RDF to an image on a substrate, such as a mask (reticle) 1123 or a semiconductor wafer 1133. The IC design layout diagram 1111 is manipulated by the mask data preparation 1121 to comply with particular characteristics of the mask writer and/or requirements of the IC fab 1130. In FIG. 11, the data preparation 1121 and the mask fabrication 1122 are illustrated as separate elements. In some embodiments, the data preparation 1121 and the mask fabrication 1122 is able to be collectively referred to as mask data preparation.

In some embodiments, the data preparation 1121 includes optical proximity correction (OPC) which uses lithography enhancement techniques to compensate for image errors, such as those that can arise from diffraction, interference, other process effects and the like. OPC adjusts the IC design layout diagram 1111. In some embodiments, the data preparation 1121 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the data preparation 1121 includes a mask rule checker (MRC) that checks the IC design layout diagram 1111 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1111 to compensate for limitations during the mask fabrication 1122, which may undo part of the modifications performed by OPC in order to meet mask creation rules.

In some embodiments, the data preparation 1121 includes lithography process checking (LPC) that simulates processing that will be implemented by the IC fab 1130 to fabricate the IC device 1140. LPC simulates this processing based on the IC design layout diagram 1111 to create a simulated manufactured device, such as the IC device 1140. The processing parameters in LPC simulation is able to include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 1111.

It should be understood that the above description of data preparation 1121 has been simplified for the purposes of clarity. In some embodiments, the data preparation 1121 includes additional features such as a logic operation (LOP) to modify the IC design layout diagram 1111 according to manufacturing rules. Additionally, the processes applied to the IC design layout diagram 1111 during the data preparation 1121 may be executed in a variety of different orders.

After the data preparation 1121 and during the mask fabrication 1122, a mask 1123 or a group of masks 1123 are fabricated based on the modified the IC design layout diagram 1111. In some embodiments, the mask fabrication 1122 includes performing one or more lithographic exposures based on the IC design layout diagram 1111. In some embodiments, an electron-beam (e-beam) or a mechanism of multiple e-beams is used to form a pattern on a mask (photomask or reticle) 1123 based on the modified the IC design layout diagram 1111. The mask 1123 is able to be formed in various technologies. In some embodiments, the mask 1123 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of the mask 1123 includes a transparent substrate (for example, fused quartz) and an opaque material (for example, chromium) coated in the opaque regions of the binary mask. In another example, mask 1123 is formed using a phase shift technology. In a phase shift mask (PSM) version of the mask 1123, various features in the pattern formed on the phase shift mask are configured to have proper phase difference to enhance the resolution and imaging quality. In various examples, the phase shift mask is able to be attenuated PSM or alternating PSM. The mask(s) generated by the mask fabrication 1122 is used in a variety of processes. For example, such a mask(s) is used in an ion implantation process to form various doped regions in a semiconductor wafer 1133, in an etching process to form various etching regions in the semiconductor wafer 1133, and/or in other suitable processes.

The IC fab 1130 includes the wafer fabrication 1132. The IC fab 1130 is an IC fabrication business that includes one or more manufacturing facilities for the fabrication of a variety of different IC products. In some embodiments, the IC Fab 1130 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

The IC fab 1130 uses the mask(s) 1123 fabricated by the mask house 1120 to fabricate the IC device 1140. Thus, the IC fab 1130 at least indirectly uses the IC design layout diagram 1111 to fabricate the IC device 1140. In some embodiments, the semiconductor wafer 1133 is fabricated by the IC fab 1130 using the mask(s) 1123 to form the IC device 1140. In some embodiments, the IC fabrication includes performing one or more lithographic exposures based at least indirectly on the IC design layout diagram 1111. The semiconductor wafer 1133 includes a silicon substrate or other proper substrate having material layers formed thereon. The semiconductor wafer 1133 further includes one or more of various doped regions, dielectric features, multilevel interconnects, and the like (formed at subsequent manufacturing steps).

With respect to the methods 100 and 200 for automatically classifying DRC violations and generating corresponding fixing strategies, the DRC violations is fixed systematically. The user is able to understand the DRC violations according to the classification. Violations associated with routing congestions are identified to avoid unnecessary trials of non-congestion strategies. A number of the DRC violations after ADF is reduced comparing with fixing the DRC violations manually. Furthermore, the fixing time is also reduced.

Also disclosed is a method that includes: receiving design rule violations of a first layout; classifying, according to first chip features of the first layout, a first violation of the design rule violations into a first class of predefined classes; generating a first vector array for at least one of the first chip features of the first layout, that is associated with the first violation; selecting, according to the first vector array, first operations from pre-stored operations; generating a second layout based on the first layout and the first operations.

Also disclosed is a system that includes a memory and a processor. The memory is configured to store computer program codes. The processor is configured to execute the computer program codes in the memory to: categorize design rule violations into predefined categories according to data of the design rule violations of a first layout of a chip, automatically assign first operations of pre-stored operations to each of the design rule violations according to the data of the design rule violations of the first layout and generate a second layout based on the first layout and the first operations.

Also disclosed is a method that includes: sorting, according to chip features of a first layout of a chip which include at least one of structure features, environment features, violation types or circuit issues of the first layout, each one of design rule violations of the first layout into predefined categories; assigning, according to one of the predefined categories and at least one of the chip features associated with each one of the design rule violations, first operations of pre-stored operations to the design rule violations; modifying the first layout according to the first operations to generate a second layout; manufacturing the chip based on the second layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving design rule violations of a first layout;
classifying, according to first chip features of the first layout, a first violation of the design rule violations into a first class of predefined classes;
generating a first vector array for at least one of the first chip features of the first layout, that is associated with the first violation;
selecting, according to the first vector array, first operations from pre-stored operations;
generating a second layout based on the first layout and the first operations;
receiving first design rule violations of the second layout;
classifying, according to second chip features of the second layout, a second violation of the first design rule violations of the second layout into a second class of the predefined classes;
generating a second vector array for at least one of the second chip features of the second layout that is associated with the second violation;
selecting, according to the second vector array, second operations from the pre-stored operations; and
generating a third layout based on the second layout and the second operations,
wherein classifying the first violation comprises:
according to a metal density of a layer of the first layout, where the first violation is generated, identifying the first violation which corresponds to routing congestions, wherein identifying the first violation comprises:
comparing a value of the metal density with a preset value; and
when the value of the metal density is larger than or equal to the preset value, identifying the first violation corresponding to the routing congestions.

2. The method of claim 1, further comprising:
evaluating a fix rate of the first operations corresponding to the first layout by comparing a number of the design rule violations of the first layout with a number of design rule violations of the second layout.

3. The method of claim 1, further comprising:
identifying, according to at least one of the first chip features of the first layout, the first violation to which the pre-stored operations are not performed.

4. The method of claim 1, wherein classifying the first violation further comprises:

according to the metal density and a ratio of a number of violations on the layer to a total number of the design rule violations of the first layout,
identifying the first violation which corresponds to the routing congestions.

5. The method of claim 4, wherein selecting the first operations from the pre-stored operations comprises:
selecting the first operations from ones of the pre-stored operations which correspond to the routing congestions when the first violation is corresponding to the routing congestions.

6. The method of claim 1, wherein generating the first vector array comprises:
generating the first vector array according to at least one environment feature of the first chip features, wherein the at least one environment feature is associated with the first violation.

7. The method of claim 1, further comprising:
accumulating first values corresponding to the design rule violations and second values corresponding to ambient environments associated with the design rule violations; and
generating, according to the first values and the second values, at least one operation of the pre-stored operations.

8. The method of claim 1, further comprising:
determining whether the first violation belongs to a class corresponding to pin accesses;
wherein when the first violation belongs to the class corresponding to the pin accesses, the first operations comprise at least one of:
adding a blockage on a first cell where the first violation generated;
assigning a layer other than a layer of the first cell to at least one of the pin accesses; or
determining a padding value between the first cell and a second cell abutting the first cell.

9. The method of claim 1, wherein the pre-stored operations comprise at least one of:
generating at least one chip feature;
removing at least one chip feature; or
modifying at least one chip feature.

10. The method of claim 1, wherein selecting the first operations comprises:
automatically selecting, by a processor of a computer, the first operations from the pre-stored operations stored in a memory of the computer.

11. A system, comprising:
a memory configured to store computer program codes; and
a processor configured to execute the computer program codes in the memory to:
categorize design rule violations into predefined categories according to data of the design rule violations of a first layout of a chip;
automatically assign first operations of pre-stored operations to each of the design rule violations according to the data of the design rule violations of the first layout;
generate a second layout based on the first layout and the first operations;
categorize some of the design rule violations to a first category of routing congestions, a second category of non-congestion, and a third category which the pre-stored operations are not performed to design rule violations herein;
receive first design rule violations of the second layout;
classify, according to chip features of the second layout, a violation of the first design rule violations of the second layout into one of the first category, the second category and the third category;
generate a vector array for at least one of the chip features of the second layout that is associated with the violation;
select, according to the vector array, second operations from the pre-stored operations; and
generate a third layout based on the second layout and the second operations,
wherein the first category, the second category and the third category are different from each other,
the memory is further configured to store a first fix strategy pool corresponding to the first category and a second fix strategy pool corresponding to the second category,
when a first violation of the design rule violations is categorized to the first category, the processor is configured to select first strategies from first fix strategy pool for fixing the first violation, and
the processor is further configured to generate second strategies that are not stored in the first fix strategy pool and the second fix strategy pool, according to the first violation.

12. The system of claim 11, wherein the processor is further configured to compare a number of the design rule violations of the first layout with a number of design rule violations of the second layout to generate a fix rate of the first operations corresponding to the first layout, and further configured to adjust the first operations according to the fix rate.

13. The system of claim 11, wherein the memory is further configured to store the data associated with at least one of structure features, environment features, violation types or circuit issues.

14. The system of claim 11, wherein the processor is further configured to add a blockage on the first layout or rearrange pin accesses of the first layout according to the data when the design rule violations are associated with the pin accesses.

15. The system of claim 11, wherein when some of the design rule violations correspond to the first category, the first operations comprise:
detouring a metal wire to bypass the routing congestions; or
relocating buffers in a region of the routing congestions.

16. A method, comprising:
sorting, according to chip features of a first layout of a chip which include at least one of structure features, environment features, violation types or circuit issues of the first layout, each one of design rule violations of the first layout into predefined categories;
assigning, according to one of the predefined categories and at least one of the chip features associated with each one of the design rule violations, first operations of pre-stored operations to the design rule violations;
modifying the first layout according to the first operations to generate a second layout;
receiving first design rule violations of the second layout;
classifying, according to first chip features of the second layout, a second violation of the first design rule violations of the second layout into one of the predefined categories;
generating a vector array for at least one of the first chip features of the second layout, that is associated with the second violation;

selecting, according to the vector array, second operations from the pre-stored operations;

generating a third layout based on the second layout and the second operations; and manufacturing the chip based on the third layout, wherein sorting each one of the design rule violations of the first layout into the predefined categories comprises:

sorting each one of the design rule violations according to a ratio of a number of violations on a layer of the first layout to a total number of the design rule violations of the first layout.

17. The method of claim 16, wherein sorting each one of the design rule violations of the first layout into the predefined categories comprises:

identifying, according to at least one of the chip features associated with a first violation of the design rule violations, the first violation corresponding to a category of the predefined categories which the pre-stored operations are not performed; and according to the ratio and a metal density of the layer of the first layout, where the first violation is generated, identifying, when the first violation is not corresponding to the category which the pre-stored operations are not performed, the first violation corresponding to a category of the predefined categories which corresponds to routing congestions.

18. The method of claim 17, wherein when the first violation corresponding to the category of the routing congestions, the method further comprises:

detouring a metal wire to bypass the routing congestions; or relocating buffers in a region of the routing congestions.

19. The method of claim 17, wherein assigning the first operations to the design rule violations comprises:

automatically assigning, by a processor of a computer, at least one of the first operations stored in a memory of the computer to the first violation according to the at least one of the chip features associated with a first violation, wherein the at least one of the first operations comprise at least one of:

generating at least one chip feature;

removing at least one chip feature; or modifying at least one chip feature.

20. The method of claim 16, wherein sorting each one of the design rule violations of the first layout into the predefined categories further comprises:

comparing the number with a preset number; and when the number is larger than or equal to the preset number, sorting corresponding one of the design rule violations into a category of the predefined categories which corresponds to routing congestions.

* * * * *

UNITED STATES PATENT AND TRADEMARK OFFICE
CERTIFICATE OF CORRECTION

PATENT NO. : 11,481,536 B2  
APPLICATION NO. : 17/115668  
DATED : October 25, 2022  
INVENTOR(S) : Yi-Lin Chuang et al.

Page 1 of 1

It is certified that error appears in the above-identified patent and that said Letters Patent is hereby corrected as shown below:

On the Title Page

Column 1, item (72), Line 2, regarding inventor Song Liu, delete "Nanjing (TW);" and insert therefor:
--Nanjing City (CN)--

Column 1, item (72), Line 3, regarding inventor Pei-Pei Chen, delete "Nanjing (TW);" and insert therefor:
--Nanjing City (CN)--

Signed and Sealed this
Eighteenth Day of April, 2023

Katherine Kelly Vidal
*Director of the United States Patent and Trademark Office*